US007989269B2

(12) United States Patent
Do et al.

(10) Patent No.: US 7,989,269 B2
(45) Date of Patent: Aug. 2, 2011

(54) SEMICONDUCTOR PACKAGE WITH PENETRABLE ENCAPSULANT JOINING SEMICONDUCTOR DIE AND METHOD THEREOF

(75) Inventors: Byung Tai Do, Singapore (SG); Seng Guan Chow, Singapore (SG); Heap Hoe Kuan, Singapore (SG); Linda Pei Ee Chua, Singapore (SG); Rui Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 605 days.

(21) Appl. No.: 12/047,979

(22) Filed: Mar. 13, 2008

(65) Prior Publication Data

US 2009/0230531 A1 Sep. 17, 2009

(51) Int. Cl.
*H01L 21/00* (2006.01)

(52) U.S. Cl. ........ 438/127; 438/108; 438/109; 257/686; 257/725; 257/788; 257/790; 257/E23.117

(58) Field of Classification Search .................. 257/790, 257/686, 788; 438/127, 106–112, 124, 126
See application file for complete search history.

(56) References Cited

U.S. PATENT DOCUMENTS

| | | | | |
|---|---|---|---|---|
| 7,723,852 | B1 | 5/2010 | Kim et al. | |
| 2005/0205996 | A1 | 9/2005 | Usui et al. | |
| 2006/0223239 | A1* | 10/2006 | Khaw et al. | 438/127 |
| 2006/0275952 | A1 | 12/2006 | Gowda et al. | |
| 2007/0194424 | A1 | 8/2007 | Camacho et al. | |

* cited by examiner

*Primary Examiner* — Marcos D. Pizarro
*Assistant Examiner* — Eva Yan Montalvo
(74) *Attorney, Agent, or Firm* — Robert D. Atkins; Patent Law Group

(57) ABSTRACT

A semiconductor device is made by mounting a first semiconductor die to a first substrate, forming a first encapsulant over the first semiconductor die, and forming a second encapsulant over the first encapsulant. The second encapsulant is penetrable, thermally conductive material. A second semiconductor die is mounted to the second substrate. A bond wire electrically connects the second semiconductor die to the second substrate. A passive circuit element is mounted to the second substrate. Leading with the second encapsulant, the first substrate is pressed onto the second substrate so that the second encapsulant completely covers the second semiconductor die, bond wire, and passive circuit element. The second encapsulant is then cured. A third encapsulant is formed over the first and second substrates. A shield can be disposed over the second semiconductor die with openings for the second encapsulant to flow through when pressed onto the second substrate.

25 Claims, 10 Drawing Sheets

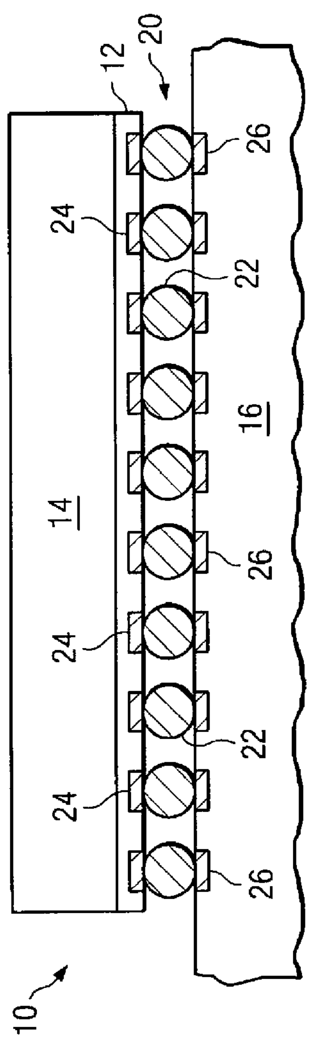
FIG. 1
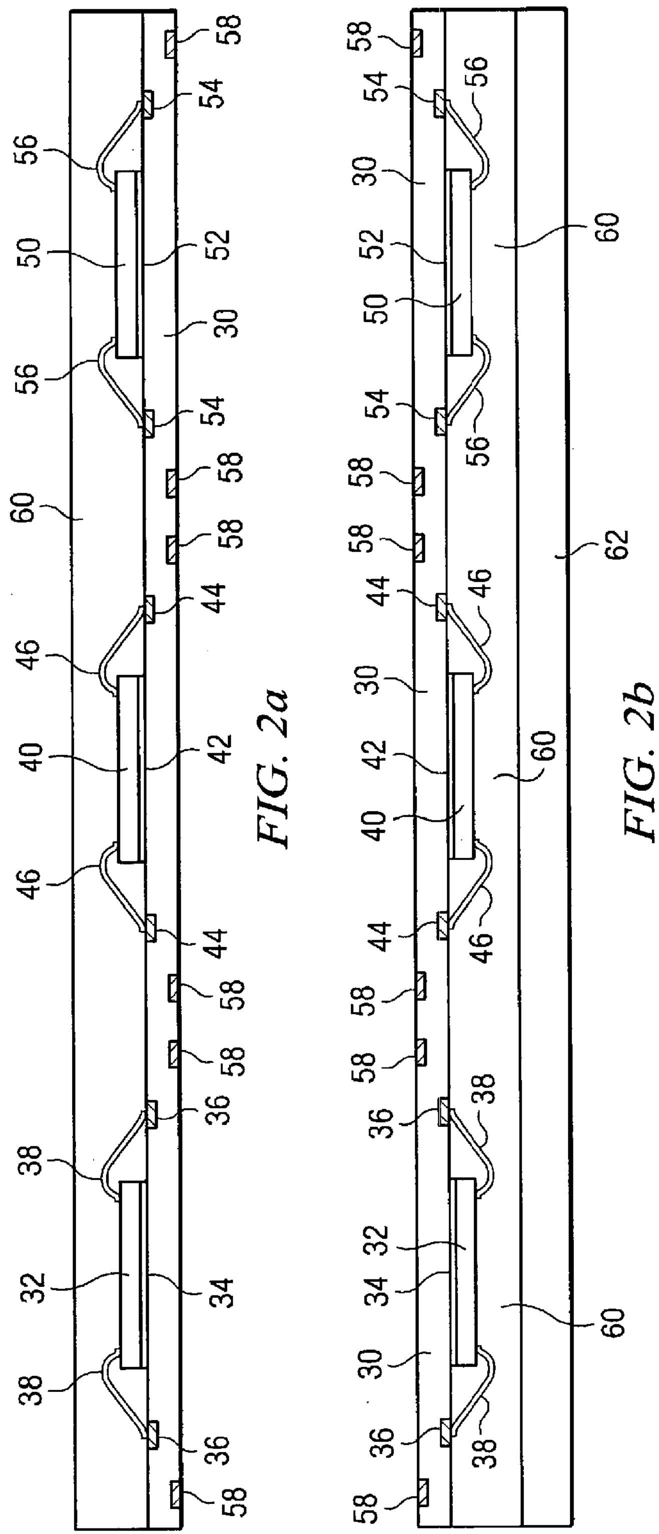
FIG. 2a
FIG. 2b 64
104
108
88
96
109
110
70
62
38
32
30
150
152
154
156
60

SEMICONDUCTOR PACKAGE WITH PENETRABLE ENCAPSULANT JOINING SEMICONDUCTOR DIE AND METHOD THEREOF

FIELD OF THE INVENTION

The present invention relates in general to semiconductor devices and, more particularly, to a semiconductor package with a penetrable encapsulant joining first and second semiconductor die.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In certain complex 3D semiconductor packages, e.g., package-in-package (PiP) and system-in-package (SiP), the individual semiconductor die and substrates are joined with adhesive layers and encapsulants. The adhesive layers and molding process adds thickness to the package, as well as further processing steps. The additional layers and processes increases costs, adds manufacturing time, and potentially reduces yield.

SUMMARY OF THE INVENTION

In one embodiment, the present invention is a method of making a semiconductor package comprising the steps of providing a first substrate, mounting a first semiconductor die to the first substrate, forming a first encapsulant over the first semiconductor die and first substrate, and forming a second encapsulant over the first encapsulant. The second encapsulant includes a penetrable, thermally conductive material. The method further includes the steps of providing a second substrate, mounting a second semiconductor die to a front side of the second substrate, electrically connecting the second semiconductor die to the second substrate with a bond wire, and mounting a passive circuit element to the second substrate. Leading with the second encapsulant, the first substrate is pressed onto the second substrate so that the second encapsulant completely covers the second semiconductor die, bond wire, and passive circuit element. The second encapsulant is then cured.

In another embodiment, the present invention is a method of making a semiconductor package comprising the steps of providing a first substrate, mounting a first semiconductor die to a front side of the first substrate, forming a first encapsulant over the first semiconductor die and first substrate, and forming a second encapsulant over the first substrate. The second encapsulant includes a penetrable material. The method further includes the steps of providing a second substrate, and mounting a second semiconductor die to a front side of the second substrate. Leading with the second encapsulant, the first substrate is pressed onto the second substrate so that the second encapsulant covers the second semiconductor die. The second encapsulant is then cured.

In another embodiment, the present invention is a method of making a semiconductor device comprising the steps of providing a first substrate, mounting a first semiconductor die to a front side of the first substrate, forming a first encapsulant over the first semiconductor die and first substrate, and forming a second encapsulant over the first substrate. The second encapsulant includes a penetrable material. The method further includes the steps of providing a second substrate, and disposing a second semiconductor die adjacent to the second substrate. Leading with the second encapsulant, the first substrate is pressed onto the second semiconductor die and second substrate so that the second encapsulant covers the second semiconductor die. The second encapsulant is then cured.

In another embodiment, the present invention is a semiconductor device comprising first and second substrates. A first semiconductor die is mounted to a front side of the first substrate. A first encapsulant is formed over the first semiconductor die and first substrate. A second encapsulant is formed over the first substrate. The second encapsulant includes a penetrable material. A second semiconductor die is disposed adjacent to the second substrate. The second encapsulant is pressed onto the second semiconductor die and second substrate so that the second encapsulant covers the second semiconductor die.

BRIEF DESCRIPTION OF THE DRAWINGS

FIG. 1 is a semiconductor device with solder bumps providing electrical interconnect between an active area of the die and a chip carrier substrate;

FIGS. 2*a*-2*g* illustrate a process of making a semiconductor package having first and second semiconductor die joined with a penetrable encapsulant;

DETAILED DESCRIPTION OF THE DRAWINGS

Figure 2C:
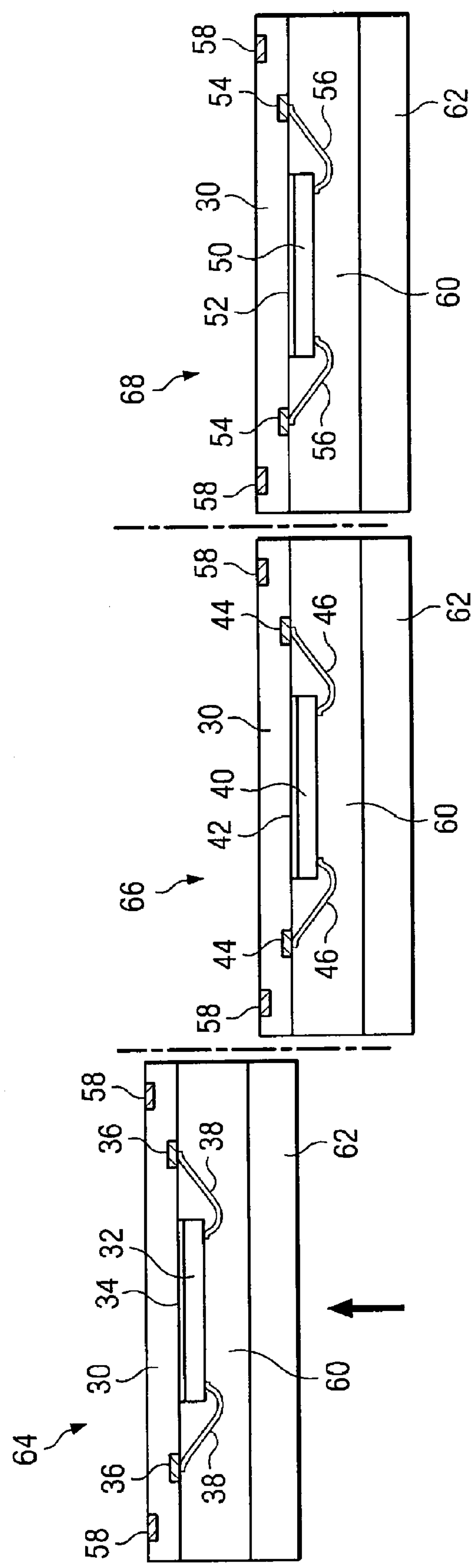

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive devices formed within active area 12. For example, an analog circuit may include one or more inductors, capacitors, and resistors formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

In FIG. 2*a*, semiconductor substrate 30 is made of silicon or other bulk semiconductor material. A plurality of semiconductor die are mounted or attached to a front side of substrate 30. Each semiconductor die has active devices and integrated passive devices (IPD), conductive layers, and dielectric layers formed on its active surface according to the electrical design of the die. Semiconductor die 32 is attached to a front side of substrate 30 with die attach adhesive 34. The active surface of semiconductor die 32 is electrically connected to contact pads 36 on substrate 30 using wire bonds 38 to route electrical signals to various conduction tracks in the substrate. Semiconductor die 40 is attached to a front side of substrate 30 with die attach adhesive 42. The active surface of semiconductor die 40 is electrically connected to contact pads 44 on substrate 30 using wire bonds 46 to route electrical signals to various conduction tracks in the substrate. Semiconductor die 50 is attached to a front side of substrate 30 with die attach adhesive 52. The active surface of semiconductor die 50 is electrically connected to contact pads 54 on substrate 30 using wire bonds 56 to route electrical signals to various conduction tracks in the substrate. A plurality of contact pads 58 is formed on a backside of substrate 30, opposite the die attach front side, for electrical interconnect. A molding compound or encapsulant 60 is deposited over semiconductor die 32, 40, and 50, as well as substrate 30. The molding compound 60 is non-conductive and environmentally protects the semiconductor device from external elements and contaminants. Molding compound 60 can be made with epoxy acrylate or other polymer material and applied by transfer molding, liquid encapsulant molding, or other molding process.

In FIG. 2*b*, substrate 30 and attached semiconductor die 32, 40, and 50 are inverted. A penetrable encapsulant 62 is deposited over encapsulant 60, representing a double encapsulation. In one embodiment, penetrable encapsulant 62 is a B-stage wire in film (WIF) adhesive. Encapsulant 62 is a curable, flowable, thermally conductive material, e.g., a viscous gel, as disclosed in US patent publication 20060275952 and incorporated herein by reference. Alternately, penetrable encapsulant 62 can be a dicing layer. In FIG. 2*c*, semiconductor die 32, 40, and 50 are singulated into individual packages 64, 66, and 68, each with layers of encapsulant 60 and penetrable encapsulant 62. The individual semiconductor die 32, 40, and 50 can be electrically tested for functionality.

Figure 2D:
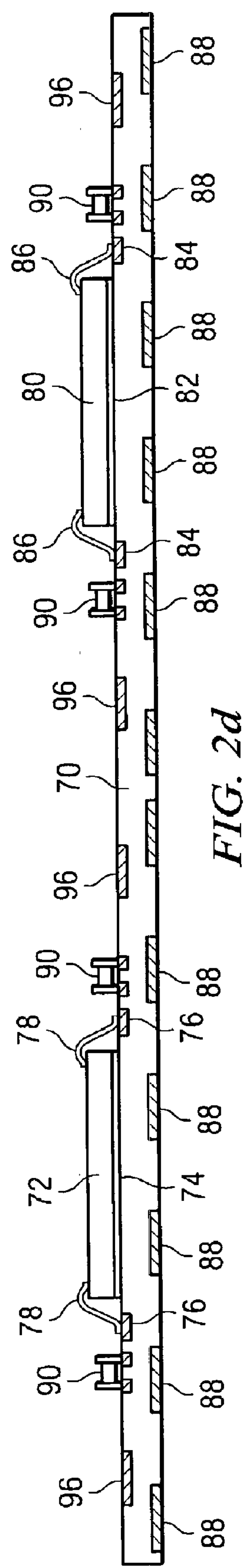

In FIG. 2*d*, a second semiconductor substrate 70 is made of silicon or other bulk semiconductor material. A plurality of semiconductor die is mounted or attached to a front side of substrate 70. Each semiconductor die has active devices and IPD, conductive layers, and dielectric layers formed on its active surface according to the electrical design of the die. Semiconductor die 72 is attached to a front side of substrate 70 with die attach adhesive 74. The active surface of semiconductor die 72 is electrically connected to contact pads 76 on substrate 70 using wire bonds 78 to route electrical signals to various conduction tracks in the substrate. Semiconductor die 80 is attached to a front side of substrate 70 with die attach adhesive 82. The active surface of semiconductor die 80 is electrically connected to contact pads 84 on substrate 70 using wire bonds 86 to route electrical signals to various conduction tracks in the substrate. A plurality of contact pads or under bump metallization layer (UBM) 88 is formed on a backside of substrate 70 for electrical interconnect. Discrete passive circuit elements 90 are electrically connected to substrate 70, as shown in FIG. 2*d*.

Figure 2E:
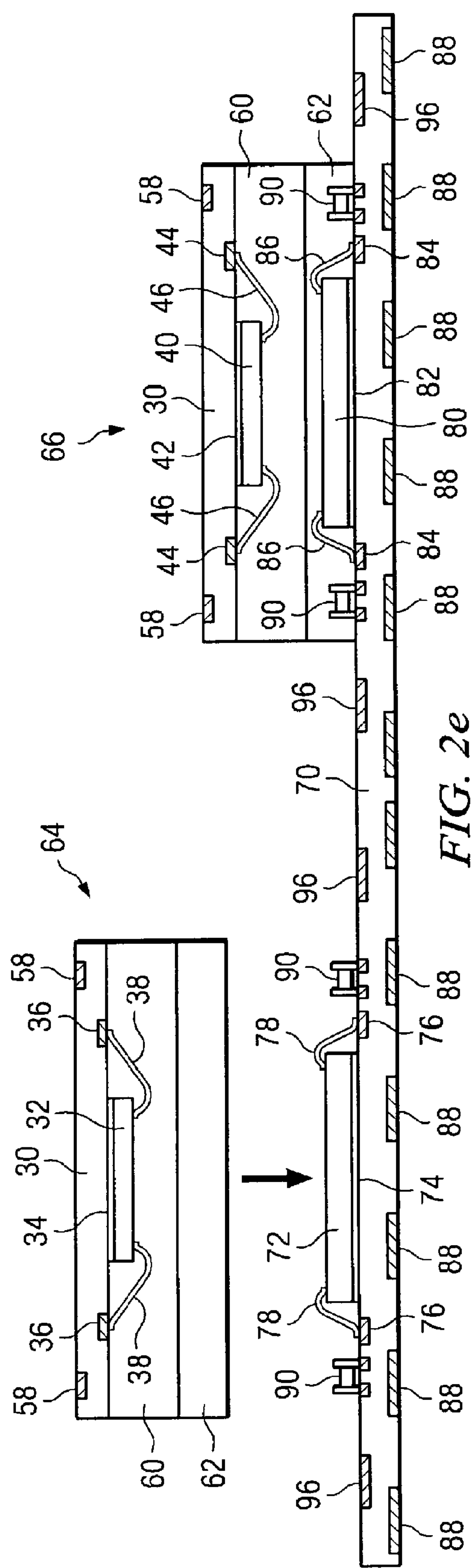

In FIG. 2*e*, the semiconductor packages 64 and 66 are aligned over and, leading with penetrable encapsulant 62, pressed onto semiconductor die 72 and 80, respectively. As semiconductor package 64 and semiconductor die 72 are pressed together, the penetrable encapsulant 62 completely encloses semiconductor die 72, wire bonds 78, and passive circuit elements 90. Likewise, as semiconductor package 66 and semiconductor die 80 are pressed together, the penetrable encapsulant 62 completely encloses semiconductor die 80, wire bonds 86, and passive circuit elements 90. Due to its flowable nature, penetrable encapsulant 62 completely covers the semiconductor die, wire bonds, and passive circuit elements, without voids or gaps. The penetrable encapsulant 62 is then cured to solidify the semiconductor package. Accordingly, semiconductor die 32 and 72, each respectively attached to substrates 30 and 70, are joined by penetrable encapsulant 62. The penetrable encapsulant simplifies the package integration by structurally joining and environmentally sealing the semiconductor die, without using die adhesive.

Figure 2F:
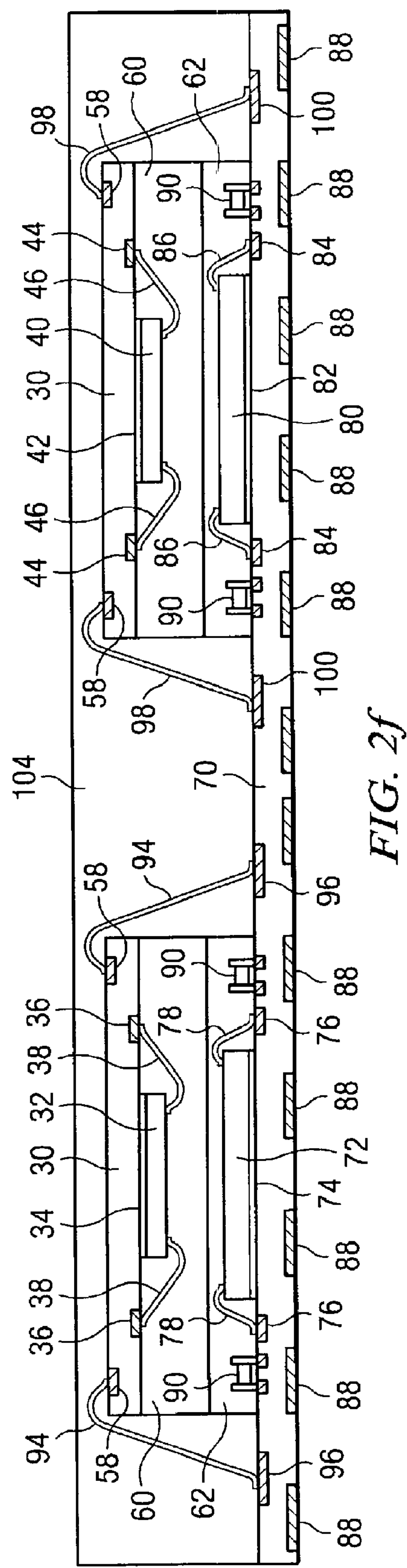

In FIG. 2*f*, wire bonds 94 electrically connect a first set of contact pads 58 on substrate 30 to contact pads 96 on substrate 70. Wire bonds 98 electrically connect a second set of contact pads 58 on substrate 30 to contact pads 100 on substrate 70. The package assembly is enclosed with molding compound or encapsulant 104. The molding compound 104 is non-conductive and environmentally protects the semiconductor device from external elements and contaminants. Molding compound 104 can be made with epoxy acrylate or other polymer material and applied by transfer molding, liquid encapsulant molding, or other molding process.

Figure 2G:
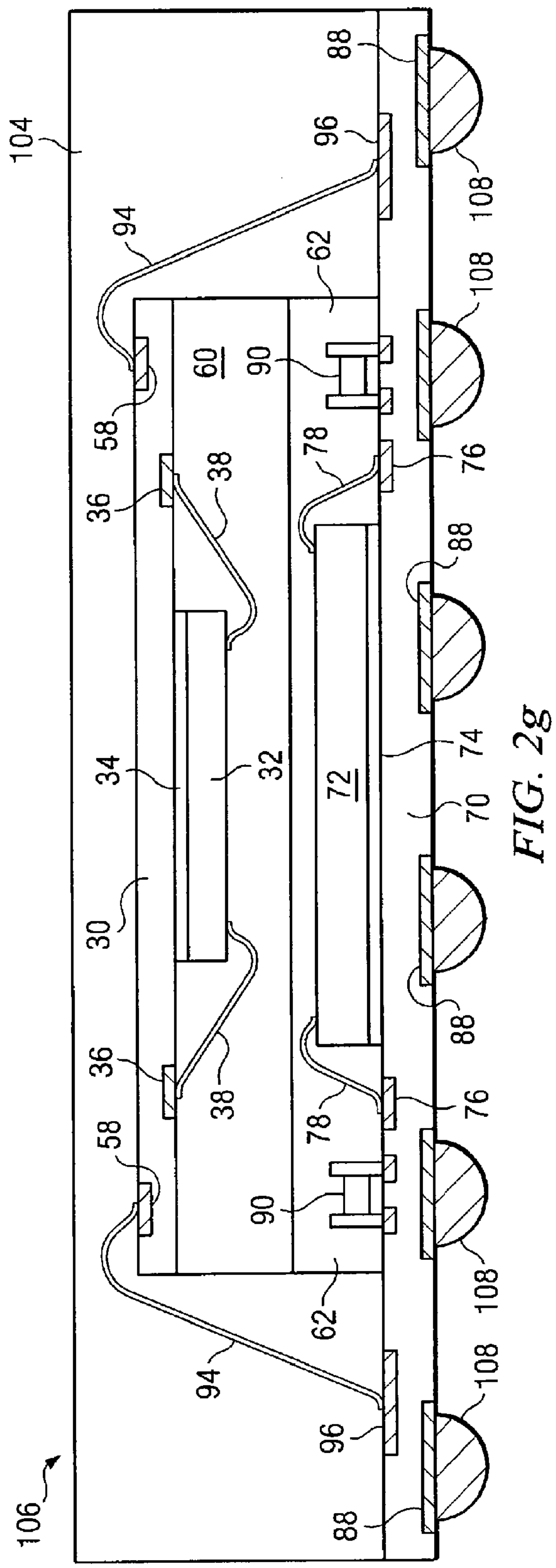

The package assembly from FIG. 2*f* is singulated into individual packages, one such semiconductor package 106 is shown in FIG. 2*g*. An electrically conductive solder material is deposited over contact pads or UBM 88 using an evaporation, electrolytic plating, electroless plating, ball drop, or screen printing process. The solder material can be any metal or electrically conductive material, e.g., tin (Sn), nickel (Ni), gold (Au), silver (Ag), lead (Pb), bismuthinite (Bi) and alloys thereof. For example, the solder material can be eutectic Sn/Pb, high lead, or lead free. The solder material is reflowed by heating the solder material above its melting point to form rounded or spherical balls or bumps 108. In some applications, solder bumps 108 are reflowed a second time to improve electrical contact to UBM 88. The solder bumps 108 provide an interconnect structure for the semiconductor die according to its functional design.

Figure 3:
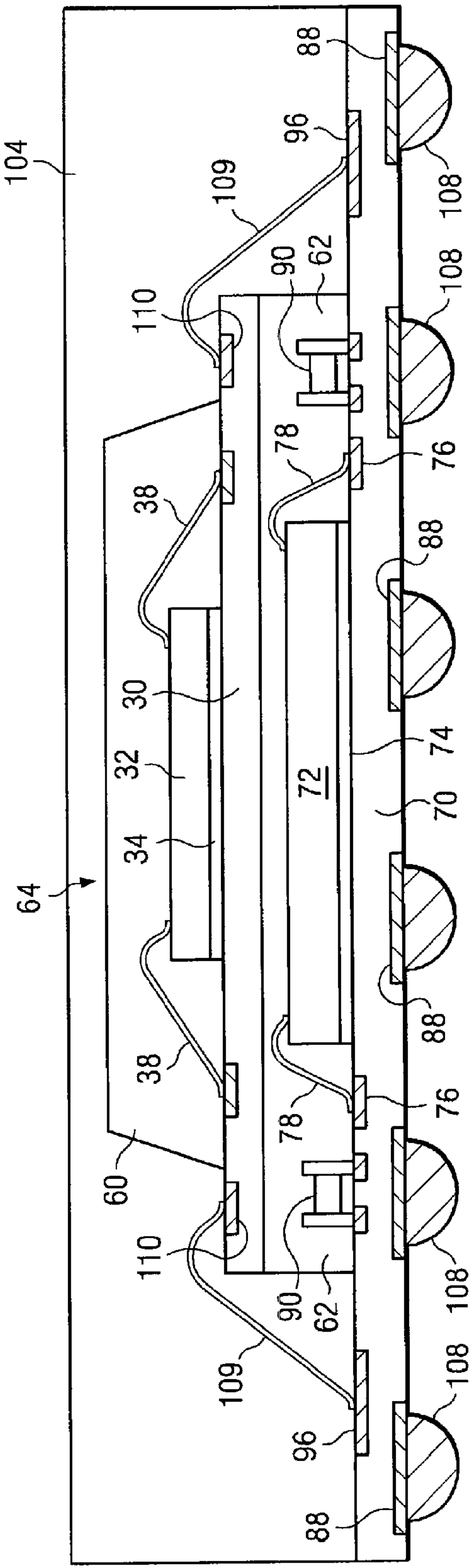
FIG. 3 illustrates the semiconductor package with the penetrable encapsulant on a backside of the substrate.

FIG. 3 illustrates an alternate embodiment of semiconductor package 64 with semiconductor die 32 inverted with respect to the orientation shown in FIG. 2*g*. In this case, penetrable encapsulant 62 is deposited on a backside of substrate 30, opposite the front side where semiconductor die 32 is attached. Leading with penetrable encapsulant 62, the semiconductor package 64 is aligned over and pressed onto semiconductor die 72 and discrete passive circuit elements 90. As semiconductor package 64 and semiconductor die 72 are pressed together, the penetrable encapsulant 62 flows in and around semiconductor die 72, wire bonds 78, and passive circuit elements 90 to enclose these features without voids or gaps. The penetrable encapsulant 62 is then cured to solidify the semiconductor package and permanently join semiconductor die 32 and 72. Wire bonds 109 electrically connect contact pads 110 on substrate 30 to contact pads 96 on substrate 70 according to the function of semiconductor die 32.

Figure 4:
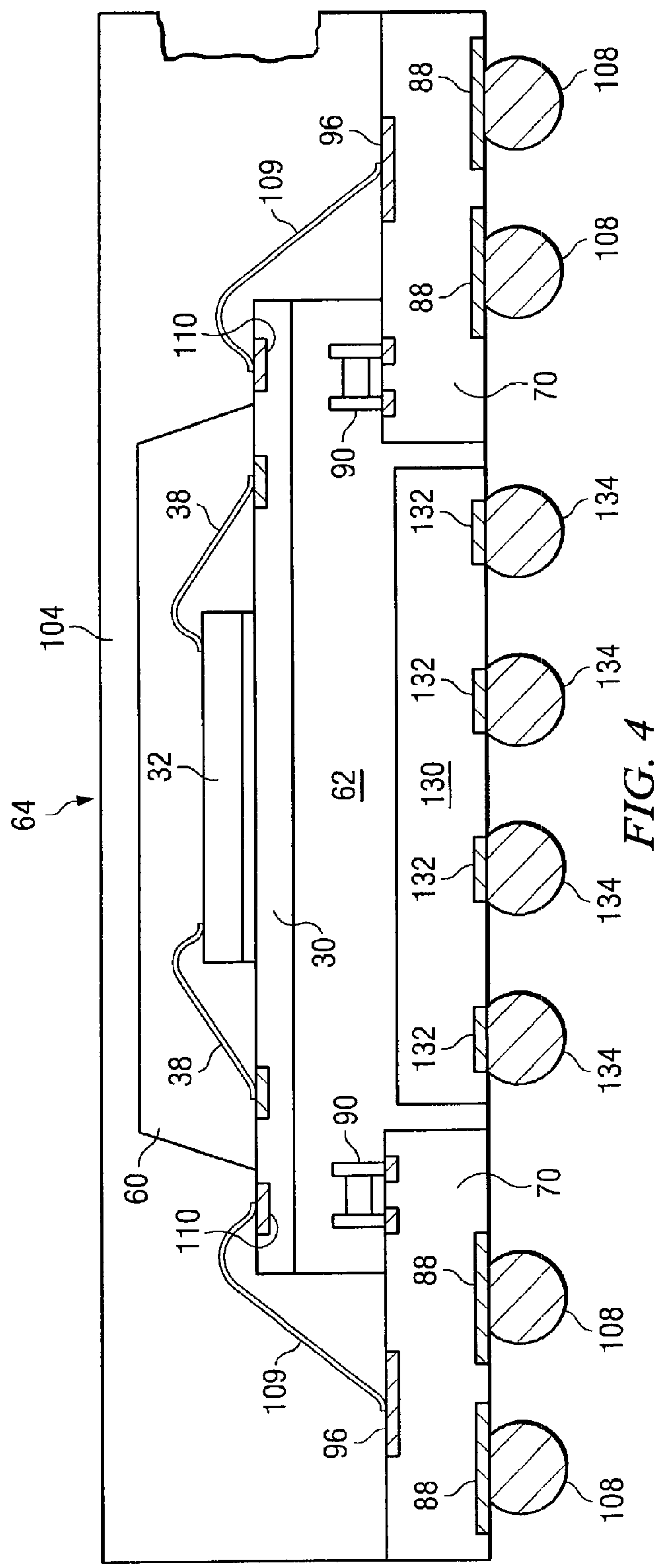
FIG. 4 illustrates the semiconductor package with the penetrable encapsulant covering a flip chip disposed between two portions of the second substrate.

FIG. 4 shows an embodiment similar to FIG. 3 with the exception that a portion of substrate 70 is removed and flip chip 130 is disposed in its place adjacent to the substrate. Solder bumps 134 are formed on UBM 132 for flip chip 130. When semiconductor package 64 is pressed into place, the penetrable encapsulant 62 flows in and around flip chip 130 and discrete passive circuit elements 90 to enclose these features without voids or gaps. The penetrable encapsulant 62 is then cured to solidify the semiconductor package and permanently join semiconductor die 32 and flip chip 130. Wire bonds 109 electrically connect contact pads 110 on substrate 30 to contact pads 96 on substrate 70 according to the function of semiconductor die 32. Semiconductor die 32 can be a known good package/die such as an inverted internal stacked modules (ISM), interposer, tested die, or pre-molded package.

Figure 5:
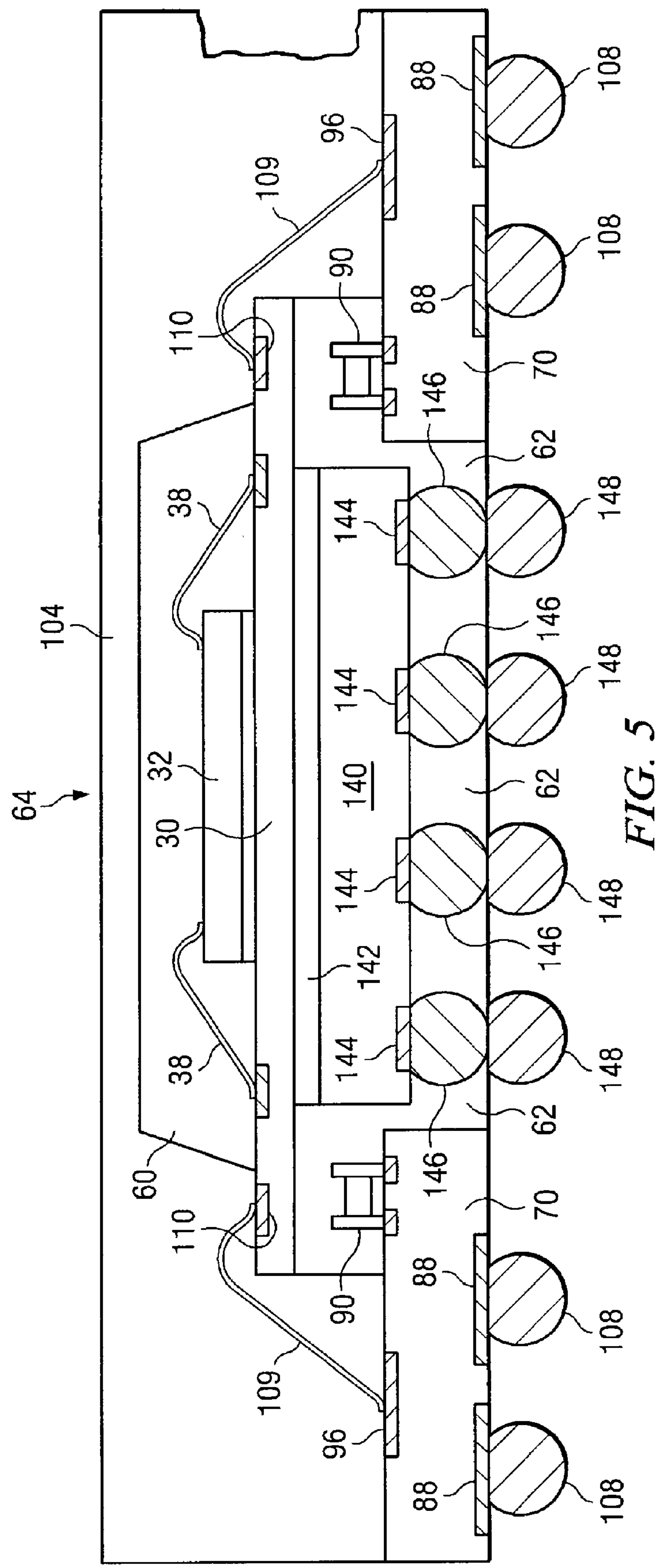
FIG. 5 illustrates a second embodiment of the semiconductor package with the penetrable encapsulant covering a flip chip.

In FIG. 5, flip chip 140 is optionally attached to the backside of substrate 30 with an epoxy adhesive 142 prior to depositing penetrable encapsulant 62. Solder bumps 146 are formed on UBM 144 for flip chip 140. Penetrable encapsulant 62 is deposited on the backside of substrate 30 over flip chip 140. A portion of substrate 70 is removed. When the semiconductor package is pressed into place, the penetrable encapsulant 62 flows in and around semiconductor die 140, substrate 70, solder bumps 146, and discrete passive circuit elements 90 to enclose these features without voids or gaps. The penetrable encapsulant 62 is then cured to solidify the semiconductor package and permanently join semiconductor die 32 and flip chip 140. Solder bumps 148 are formed on solder bumps 146. Wire bonds 109 electrically connect contact pads 110 on substrate 30 to contact pads 96 on substrate 70 according to the function of semiconductor die 32. Semiconductor die 32 can be a known good package/die such as an inverted ISM, interposer, tested die, or pre-molded package.

Figure 6:
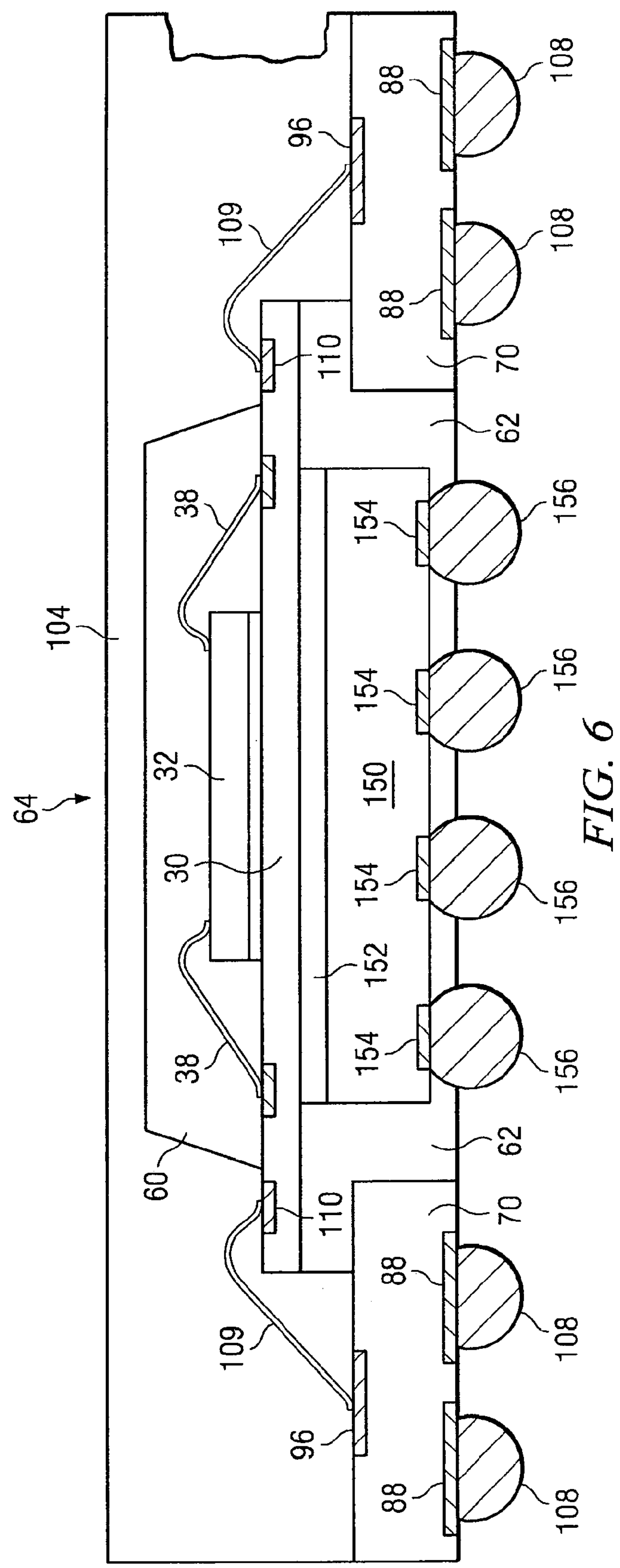
FIG. 6 illustrates a third embodiment of the semiconductor package with the penetrable encapsulant covering a flip chip.

In FIG. 6, flip chip 150 is optionally attached to the backside of substrate 30 with an epoxy adhesive 152 prior to depositing penetrable encapsulant 62. The bottom side of flip chip 150 is disposed above the bottom side of substrate 70. Solder bumps 156 are formed on UBM 154 for flip chip 150. Penetrable encapsulant 62 is deposited on the backside of substrate 30 over flip chip 150. A portion of substrate 70 is removed. When the semiconductor package is pressed into place, the penetrable encapsulant 62 flows in and around semiconductor die 150, substrate 70, and solder bumps 156 to enclose these features without voids or gaps. Solder bumps 156 extend through penetrable encapsulant 62. The penetrable encapsulant 62 is then cured to solidify the semiconductor package and permanently join semiconductor die 32 and flip chip 150. Wire bonds 109 electrically connect contact pads 110 on substrate 30 to contact pads 96 on substrate 70 according to the function of semiconductor die 32.

Figure 7:
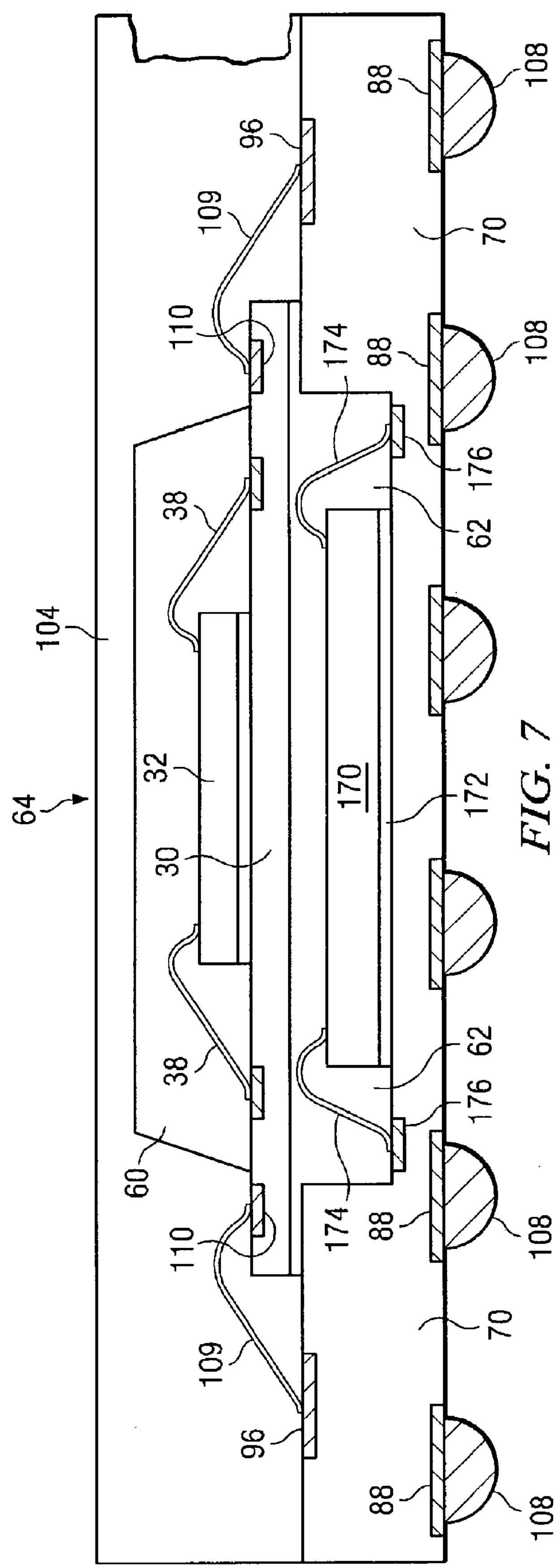
FIG. 7 illustrates the semiconductor package with the penetrable encapsulant covering the second semiconductor die disposed in a recessed region of the second substrate.

FIG. 7 shows an embodiment similar to FIG. 3 with the exception that a portion of substrate 70 is removed to form a partial cavity area or recessed region. Semiconductor die 170 is disposed in the recessed region and attached to substrate 70 with an epoxy adhesive 172. Wire bonds 174 electrically connect semiconductor die 170 to contact pads 176 on substrate 70. When the semiconductor package is pressed into place, the penetrable encapsulant 62 flows in and around semiconductor die 170 and wire bonds 174 to enclose these features without voids or gaps. The penetrable encapsulant 62 is then cured to solidify the semiconductor package and permanently join semiconductor die 32 and 170. Wire bonds 109 electrically connect contact pads 110 on substrate 30 to contact pads 96 on substrate 70 according to the function of semiconductor die 32.

Figure 8:
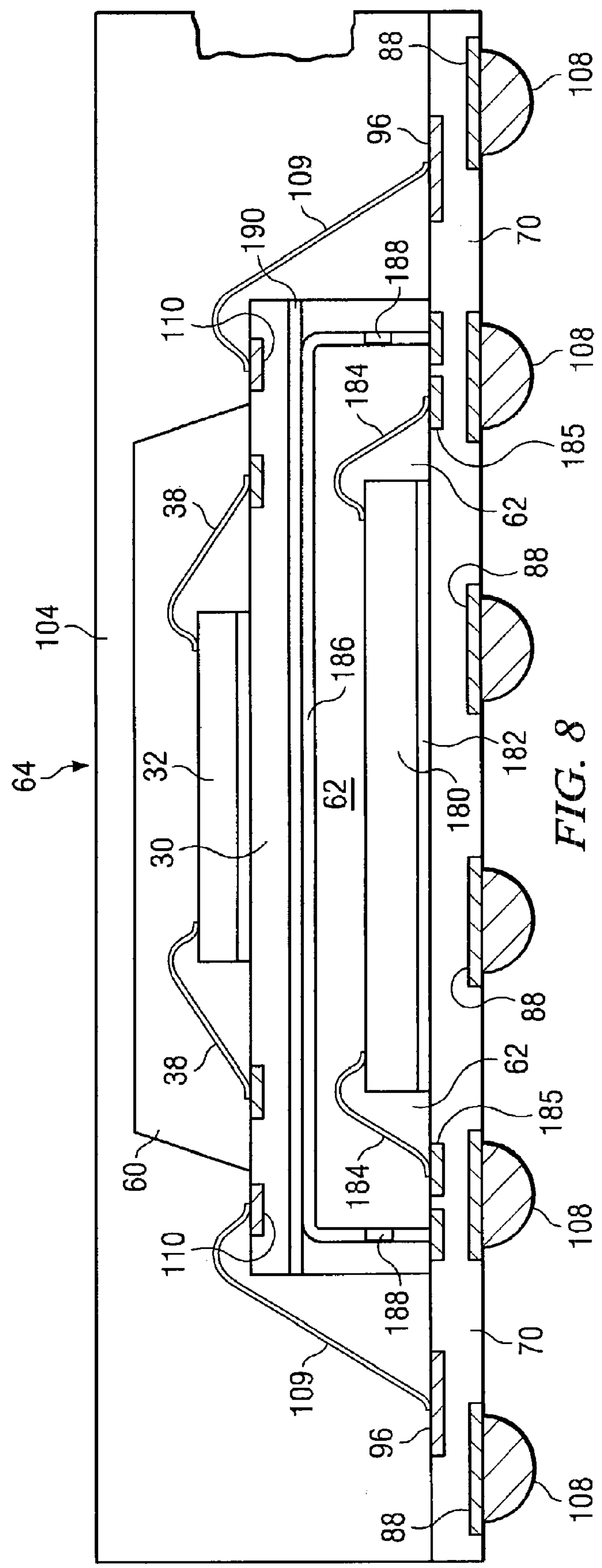
FIG. 8 illustrates the semiconductor package with a shield covering the second semiconductor die and having openings for passing the penetrable encapsulant.

In FIG. 8, a semiconductor die 180 is attached to substrate 70 with an epoxy adhesive 182. Wire bonds 184 electrically connect semiconductor die 180 to contact pads 185 on substrate 70. A shield 186 is disposed over semiconductor die 180 and attached to substrate 30 with epoxy adhesive 190 for protection against electromagnetic interference (EMI). Shield has a number of openings 188. When the semiconductor package is pressed into place, the penetrable encapsulant 62 flows through openings 188 to cover semiconductor die 180 and wire bonds 184, without voids or gaps. The penetrable encapsulant 62 is then cured to solidify the semiconductor package and permanently join semiconductor die 32 and 180. Wire bonds 109 electrically connect contact pads 110 on substrate 30 to contact pads 96 on substrate 70 according to the function of semiconductor die 32.

Figure 9:
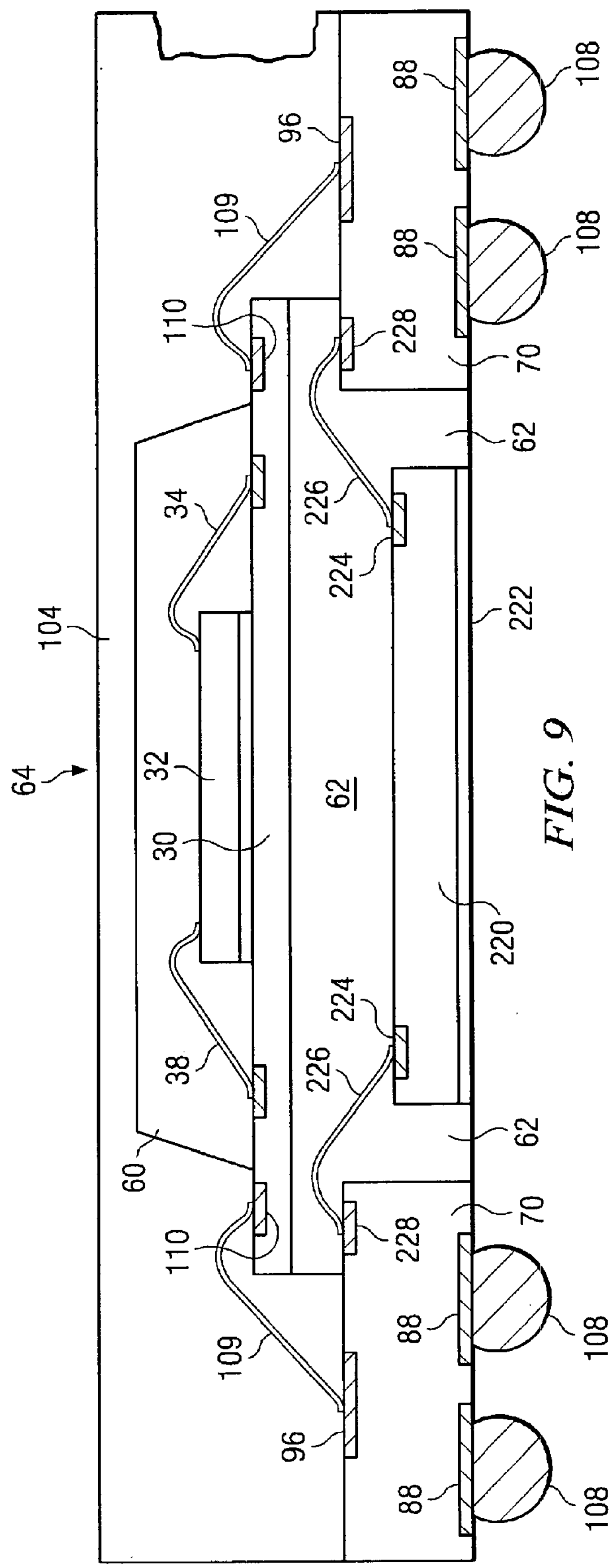
FIG. 9 illustrates the semiconductor package with the penetrable encapsulant covering the second semiconductor die disposed between two portions of the second substrate.

FIG. 9 shows an embodiment similar to FIG. 3 with the exception that a portion of substrate 70 is removed to form a full cavity area. Semiconductor die 220 is disposed in the recessed region and attached to substrate 70 with an epoxy adhesive 222. Wire bonds 226 electrically connect contact pads 224 on semiconductor die 220 to contact pads 228 on substrate 70. When the semiconductor package is pressed into place, the penetrable encapsulant 62 flows in and around semiconductor die 220 and wire bonds 226 to enclose these features without voids or gaps. The penetrable encapsulant 62 is then cured to solidify the semiconductor package and permanently join semiconductor die 32 and 220. Wire bonds 109 electrically connect contact pads 110 on substrate 30 to contact pads 96 on substrate 70 according to the function of semiconductor die 32.

In summary, a manufacturing process for a 3D semiconductor package (PiP or SiP) is simplified by combining bottom die/package encapsulation with top die/package attachment. A double encapsulation process forms a molding compound and penetrable encapsulation material on a first semiconductor die. The penetrable encapsulation material is flowable and curable to enclose and structurally join a second semiconductor die, while providing environmental protection and better wire bonding. In addition, the semiconductor package can be made thinner by eliminating molding process and adhesive layers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor package, comprising:

providing a first substrate;

mounting a first semiconductor die to the first substrate;

forming a first encapsulant over the first semiconductor die and first substrate;

forming a second encapsulant over the first encapsulant, the second encapsulant including a penetrable, thermally conductive material;

providing a second substrate;

mounting a second semiconductor die to a front side of the second substrate;

electrically connecting the second semiconductor die to the second substrate with a bond wire;

mounting a passive circuit element to the second substrate;

leading with the second encapsulant, pressing the first substrate onto the second substrate so that the second encapsulant completely covers the second semiconductor die, bond wire, and passive circuit element; and curing the second encapsulant.

2. The method of claim 1, further including:

electrically connecting the first semiconductor die to the first substrate; and electrically connecting the first substrate to the second substrate.

3. The method of claim 1, wherein the penetrable, thermally conductive material includes a viscous gel.

4. The method of claim 1, further including forming an interconnect structure on a backside of the second substrate, opposite the front side of the second substrate.

5. The method of claim 1, further including forming a third encapsulant over the first and second substrates.

6. A method of making a semiconductor package, comprising:

providing a first substrate;

mounting a first semiconductor die to a front side of the first substrate;

forming a first encapsulant over the first semiconductor die and first substrate;

forming a second encapsulant over the first substrate, the second encapsulant including a penetrable material;

providing a second substrate;

mounting a second semiconductor die to a front side of the second substrate;

leading with the second encapsulant, pressing the first substrate onto the second substrate so that the second encapsulant covers the second semiconductor die; and curing the second encapsulant.

7. The method of claim 6, wherein the second encapsulant is formed over the front side of the first substrate or the second encapsulant is formed over a backside of the first substrate, opposite the front side of the first substrate.

8. The method of claim 6, further including:

electrically connecting the second semiconductor die to the second substrate with a bond wire; and mounting a passive circuit element to the second substrate.

9. The method of claim 8, wherein the second encapsulant completely covers the second semiconductor die, bond wire, and passive circuit element.

10. The method of claim 6, further including:

electrically connecting the first semiconductor die to the first substrate; and electrically connecting the first substrate to the second substrate.

11. The method of claim 6, wherein the penetrable material includes a viscous gel.

12. The method of claim 6, further including forming an interconnect structure on a backside of the second substrate, opposite the front side of the second substrate.

13. The method of claim 6, further including forming a third encapsulant over the first and second substrates.

14. The method of claim 6, further including disposing a shield over the second semiconductor die, the shield having an opening for the second encapsulant to flow through when pressed onto the second substrate.

15. A method of making a semiconductor device, comprising:

providing a first substrate;

mounting a first semiconductor die to a front side of the first substrate;

forming a first encapsulant over the first semiconductor die and first substrate;

forming a second encapsulant over the first substrate, the second encapsulant includes a penetrable material;

providing a second substrate;

disposing a second semiconductor die adjacent to the second substrate;

leading with the second encapsulant, pressing the first substrate onto the second semiconductor die and second substrate so that the second encapsulant covers the second semiconductor die; and curing the second encapsulant.

16. The method of claim 15, wherein the second encapsulant is formed over the front side of the first substrate or the second encapsulant is formed over a backside side of the first substrate, opposite the front side of the first substrate.

17. The method of claim 15, further including:

electrically connecting the second semiconductor die to the second substrate with a bond wire; and mounting a passive circuit element to the second substrate.

18. The method of claim 17, wherein the second encapsulant completely covers the second semiconductor die, bond wire, and passive circuit element.

19. The method of claim 15, further including disposing a shield over the second semiconductor die, the shield having an opening for the second encapsulant to flow through when pressed onto the second semiconductor die and second substrate.

20. A method of making a semiconductor device, comprising:

providing a first semiconductor die;

forming an encapsulant over the first semiconductor die, the encapsulant includes a penetrable material;

providing a first substrate;

mounting a second semiconductor die to a front side of the first substrate;

leading with the encapsulant, pressing the first semiconductor die onto the second semiconductor die so that the encapsulant covers the second semiconductor die; and curing the encapsulant.

21. The method of claim 20, further including forming the encapsulant over a front side of the first semiconductor die or forming the encapsulant over a backside of the first semiconductor die, opposite the front side of the substrate.

22. The method of claim 20, further including:

forming a bond wire that electrically connects the second semiconductor die to the first substrate; and mounting a passive circuit element to the first substrate.

23. The method of claim 20 further including:

providing a second substrate;

mounting the first semiconductor die to a front side of the second substrate;

electrically connecting the first semiconductor die to the second substrate; and electrically connecting the second substrate to the first substrate.

24. The method of claim 23, further including forming a second encapsulant over the first semiconductor die and second substrate, the second encapsulant formed before forming the encapsulant including a penetrable material.

25. The method of claim 20, wherein the penetrable material includes a viscous gel.

* * * * *